United States Patent [19]

Katakura

[11] Patent Number: 4,547,741
[45] Date of Patent: Oct. 15, 1985

[54] NOISE REDUCTION CIRCUIT WITH A MAIN SIGNAL PATH AND AUXILIARY SIGNAL PATH HAVING A HIGH PASS FILTER CHARACTERISTIC

[75] Inventor: Masayuki Katakura, Yokohama, Japan

[73] Assignee: Sony Corporation, Tokyo, Japan

[21] Appl. No.: 497,415

[22] Filed: May 24, 1983

[30] Foreign Application Priority Data

May 29, 1982 [JP] Japan .................................. 57-92279

[51] Int. Cl.$^4$ ........................... H03F 1/26; H03F 3/68
[52] U.S. Cl. .................................. 330/149; 330/151; 330/260; 330/295; 333/14
[58] Field of Search ................... 330/124 R, 126, 149, 330/151, 260, 295; 333/14

[56] References Cited

U.S. PATENT DOCUMENTS

| 3,729,693 | 4/1973 | Dolby | 333/14 |
| 4,187,472 | 2/1980 | Yum | 330/260 |

FOREIGN PATENT DOCUMENTS

| 0054409 | 3/1982 | Japan | 330/149 |
| 0046511 | 3/1982 | Japan | 330/295 |

Primary Examiner—James B. Mullins
Assistant Examiner—Steven J. Mottola
Attorney, Agent, or Firm—Lewis H. Eslinger; Alvin Sinderbrand

[57] ABSTRACT

A noise reduction circuit has a main signal path and an auxiliary signal path having the characteristics of a high-pass filter with a controllable cut-off frequency, a control circuit varies the cut-off frequency of the high-pass filter as a function of the auxiliary signal path output. The auxiliary signal path current is derived as a current source output so that the summing of the main signal and auxiliary signal can be accomplished by a single operational amplifier, without requiring a buffer amplifier as in known noise reduction circuits. The auxiliary signal path includes a voltage-to-current converter having differential inputs and differential outputs, with a PN junction pair and at least first and second common emitter transistor pairs connected to the differential outputs. The output current of the first common emitter transistor pair is fed back to a differential input terminal of the voltage-to-current converter, and the auxiliary signal path output is derived from the second emitter common transistor pair.

21 Claims, 11 Drawing Figures

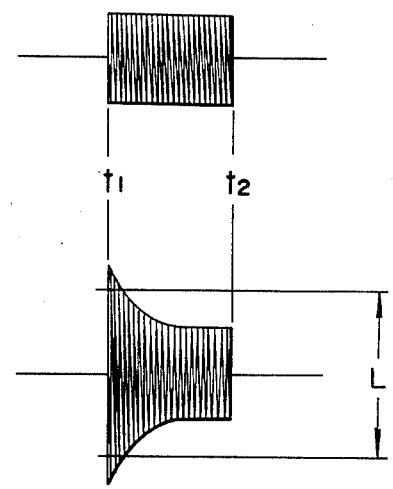
FIG. 3A
FIG. 3B
FIG. 4
(PRIOR ART)
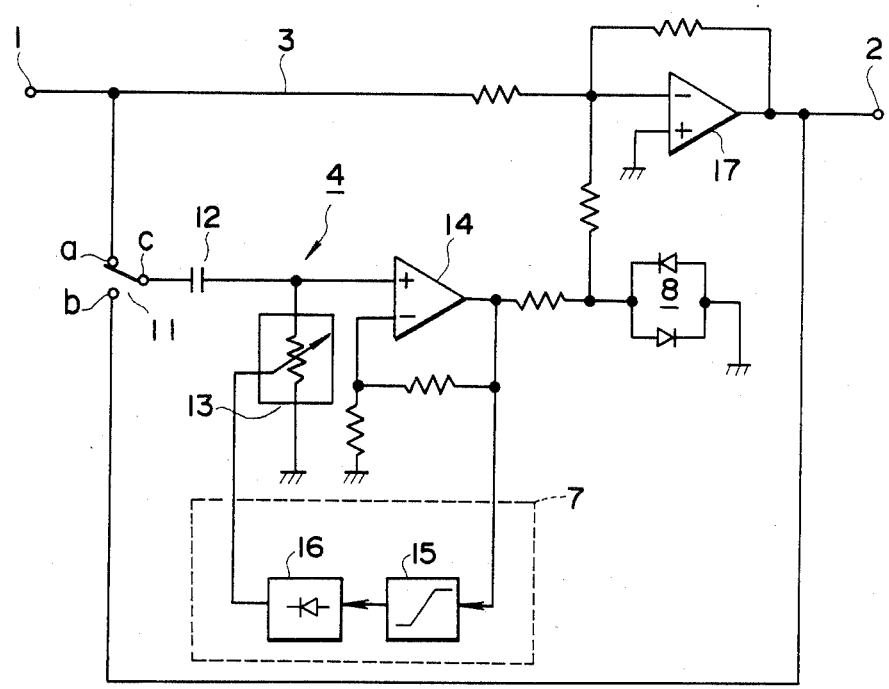

NOISE REDUCTION CIRCUIT WITH A MAIN SIGNAL PATH AND AUXILIARY SIGNAL PATH HAVING A HIGH PASS FILTER CHARACTERISTIC

BACKGROUND OF THE INVENTION

1. Field of the Invention

This invention relates generally to a system for providing signal noise reduction and, more particularly, relates to a noise reduction circuit for effectively increasing the dynamic range in a transmission system through signal compression and expansion.

2. Description of the Prior Art

A noise reduction circuit is known that is comprised of a compression circuit at the transmitter for signal compression during transmission and an expansion circuit at the receiver for signal expansion during signal reception, in order to increase the effective dynamic range of the signal transmission path. This same signal compression and expansion approach has also been applied to recording and reproduction systems, in which the signal is compressed at the input to the recording device and is expanded during reproduction. Typically, these compression and expansion systems include circuits that have a controllable transfer function, in which the transfer function of the circuit is varied depending upon signal level and/or frequency.

A noise reduction circuit of this type is shown and described in U.S. Pat. No. 3,631,365, in which the compression circuit of the noise reduction circuit includes a main signal path, an auxiliary signal path, and a summing circuit for summing the signals of the two paths to produce an output signal. The auxiliary signal path is formed of a high-pass filter having a variable cut-off frequency, a control circuit for controlling this variable cut-off frequency, and an amplitude limiting circuit. The output signal from the high-pass filter is fed to the amplitude limiting circuit through an amplifier, and the output signal from the amplitude limiting circuit is fed to the summing circuit where it is added to the main path signal. The amplitude limiting circuit is comprised of reversed, parallel-connected diodes or a similar arrangement of PN junctions and has an inherent threshold level of approximately 1.2 $V_{p-p}$ for silicon PN junctions. Because this PN junction threshold level is large when compared to the signal levels usually involved in circuits of this kind, an amplifier must be connected in the preceding stage of the amplitude limiting circuit so that the high-pass filter output signal level can be substantially greater than the threshold level of the amplitude limiting circuit. Therefore, this amplifier is not an incidental component but is an essential element, which acts not only as a buffer amplifier for the high-pass filter but also to set the limiter level. Because the auxiliary signal path output signal, which has been amplified by this amplifier, must be added to the main signal with only a small weighting factor, additional complicated circuitry is required, which further adversely affects signal precision and stability. In addition, reverse bias or drain currents flowing in the PN junctions of the amplitude limiting circuit adversely affect the remaining circuits in the system because of the common impedance of the ground circuit.

SUMMARY OF THE INVENTION

Accordingly, it is an object of the present invention to provide an improved noise reduction circuit that is relatively uncomplicated compared to known noise reduction circuits.

It is another object of the present invention to provide a noise reduction circuit for use in a signal transmission system that is simple and high in precision and which lends itself to fabrication as an integrated circuit.

It is a further object of the present invention to provide a noise reduction circuit for use in a signal transmission system in which the threshold level of the amplitude limiter can be adjusted as necessary without requiring dedicated amplifiers.

It is a still further object of the present invention to provide a noise reduction circuit in which adverse effects caused by reverse bias or drain current flowing through the amplitude limiting circuit are reduced.

In achieving these and other objects, one aspect of the noise reduction circuit according to the present invention provides a main signal path, an auxiliary signal path with the characteristic of a high-pass filter having a controllable cut-off frequency, and a circuit for summing the outputs of the main and auxiliary signal paths, in which the auxiliary signal path includes a voltage-to-current converter with a differential input pair and a differential output pair, a PN junction pair connected to the differential outputs of the voltage-to-current converter, and at least two common emitter configuration transistor pairs having the voltage difference of the PN junction pair applied across the base electrodes of each pair. A capacitor is connected to one input terminal of the voltage-to-current converter and a feedback path for feeding the collector current of the first common emitter transistor pair back to one input terminal of the voltage-to-current converter is provided. A control circuit that controls the variable cut-off frequency of the high-pass filter also controls the common emitter current of the first common emitter transistor pair, and the auxiliary signal path output is derived from the collector circuits of the second common emitter transistor pair.

The above, and other objects, features, and advantages of the present invention will be apparent from the following detailed description of an illustrative embodiment that is to be read in conjunction with the accompanying drawings, in which the same reference numerals identify the corresponding elements and parts in the several views.

BRIEF DESCRIPTION OF THE DRAWINGS

FIGS. 3A and 3B are waveform diagrams of a tone burst signal and the resultant output, respectively, in the circuit of FIG. 1;

FIG. 4 is a schematic diagram showing the prior art noise reduction circuit of FIG. 1 in more detail;

DETAILED DESCRIPTION OF PREFERRED EMBODIMENTS

Figure 1:
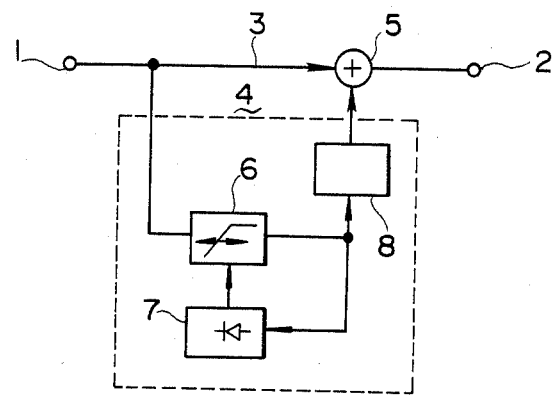
FIG. 1 is a schematic diagram showing the basic arrangement of the compression circuit of a prior art noise reduction circuit.

FIG. 1 shows a typical compression circuit known for use in a conventional noise reduction system, which is comprised of main signal path 3 connected between input terminal 1 and output terminal 2, auxiliary signal path 4, and summing unit 5. Auxiliary signal path 4 is made up of high-pass filter 6 having a variable cut-off frequency, control circuit 7 for controlling the variable cut-off frequency of high-pass filter 6, and amplitude limiter 8.

Figure 2:
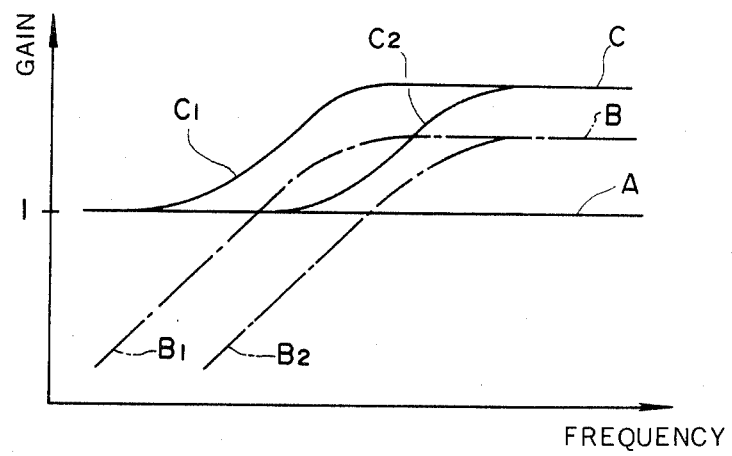
FIG. 2 is a plot of the transfer characteristic of the circuit of FIG. 1.

In FIG. 2, the transfer function characteristic A of main signal path 3 has a flat frequency characteristic of constant unity gain, while the transfer function characteristic B of auxiliary signal path 4 is determined substantially by the transfer function characteristic of high-pass filter 6. The cut-off frequency of high-pass filter 6 varies as a function of the input signal level and, thus, the cut-off frequency is lowest for a zero signal level, as shown by characteristic curve $B_1$ and increases with a corresponding increase in signal level, as shown by characteristic curve $B_2$. The transfer function characteristic C between input terminal 1 and output terminal 2 of the entire compression circuit of FIG. 1 is a combination of the transfer function characteristics A and B of signal paths 3 and 4, respectively. Curves $C_1$ and $C_2$ in FIG. 2 represent these combined characteristics for the zero signal level and the increased signal level, corresponding to curves $B_1$ and $B_2$, respectively. The dynamic range of the input signal is compressed by the operation of the circuit of FIG. 1, however, it can be restored to approximately its original value by using an expansion circuit (not shown) during reproduction or reception. The expansion circuit should have a transfer function characteristic that is complementary to that of the compression circuit. A noise reduction system with this operating principle is called a sliding band system, because the transfer function characteristic slides along the frequency axis.

In the operation of the noise reduction system of FIG. 1, if it is assumed that amplitude limiting circuit 8 is removed and the tone burst signal, as shown in FIG. 3A is supplied for a time $t_1 - t_2$, then the resultant output signal has a waveform as shown in FIG. 3B. Since there is substantially no signal before time $t_1$, the cut-off frequency of high-pass filter 6 corresponds to the zero signal level curve $B_1$ in FIG. 2. After time $t_1$, the cut-off frequency of high-pass filter 6 is shifted toward the high-frequency side by operation of control circuit 7. Nevertheless, this shifting of the cut-off frequency cannot occur instantaneously because of the finite rise time constant of control circuit 7, and this causes an overshoot of the output waveform, which may exceed the clipping level or maximum allowable level inherent in the transmission channel or the recording medium. In order to avoid this overshoot and subsequent clipping, a limiter level L, which is lower than the aforementioned clipping level, is set by amplitude limiting curcuit 8, and the effects of this limiting circuit are seen in FIG. 3B.

FIG. 4 shows a known noise reduction circuit that, while operating basically as a compression circuit, can be switched between compression and expansion by operation of changeover switch 11. The input of auxiliary signal path 4 is connected to common terminal c of changeover switch 11, with one changeover terminal a of switch 11 connected to input terminal 1 and the other changeover terminal b connected to output terminal 2. Operational amplifier 17 sums the outputs from signal paths 3 and 4 and is connected as an inverting amplifier, whereby the output signal from amplifier 17 supplied to signal path 4 through terminal b is reversed in polarity with respect to the input signal. When changeover switch 11 is switched to terminal a to effect signal compression, the signal compression transfer function C(s) between input terminal 1 and output terminal 2 may be expressed as:

$$C(s) = -(1 + T(s)) \qquad (1)$$

where T(s) represents the transfer function of the auxiliary signal path. The gain of the main signal path and that of the summing amplifier, operational amplifier 17, are selected to be 1 and −1, respectively. When switch 11 is actuated to connect terminals b and c, auxiliary signal path 4 provides a negative feedback signal path, and the signal expansion transfer function E(s) between input terminal 1 and output terminal 2 may be expressed as:

$$E(s) = \frac{1}{1 + T(s)} \qquad (2)$$

In this manner, signal expansion is accomplished that is complementary to the above-described operation of signal compression.

Referring to FIG. 4, the high-pass filter having a variable cut-off frequency is formed by capacitor 12 and current-controlled or voltage-controlled variable resistance circuit 13. The output of the high-pass filter is supplied to control circuit 7 and to amplitude limiting circuit 8 through an amplifying circuit formed of operational amplifier 14. Cut-off frequency control circuit 7 is provided by weighting circuit 15 that weights the high-frequency signal component and level sensor 16 that includes a half-wave or full-wave rectifier and a time constant circuit. The output signal from control circuit 7 controls the resistance value of variable resistance circuit 13. Amplitude limiting circuit 8 is formed by a pair of reversed, parallel-connected PN junctions, such as diodes or the like, and has a limiting level appropriate to the particular elements chosen. For instance, a silicon PN junction has a threshold value of approximately 1.2 $V_{p-p}$ as a limiter level. Because this value is large compared with the usual design signal level, the conventional practice has been to provide an amplifier, such as operational amplifer 14, ahead of amplitude limiting circuit 8, whereby the output level of the high-pass filter is raised so that the limiter level will be at an optimum level relative to the signal level. Because of this signal level relationship, operational amplifier 14 is an essential circuit element, not only as a buffer amplifier for the high-pass filter but also to set the above-described limiter level. The output signal from auxiliary signal path 4, amplified by the operational amplifier 14, must also be multiplied by a small factor before it is added to the main signal. This results in lowered precision of the signal due to these various operations of raising and lowering the signal level, with the correspondingly complicated circuit design. There is also a deficiency in these known circuits in that the reverse bias or drain current flowing in amplitude limiting circuit 8 affects the remaining portions of the circuit through the impedance of the common ground circuit.

Figure 5:
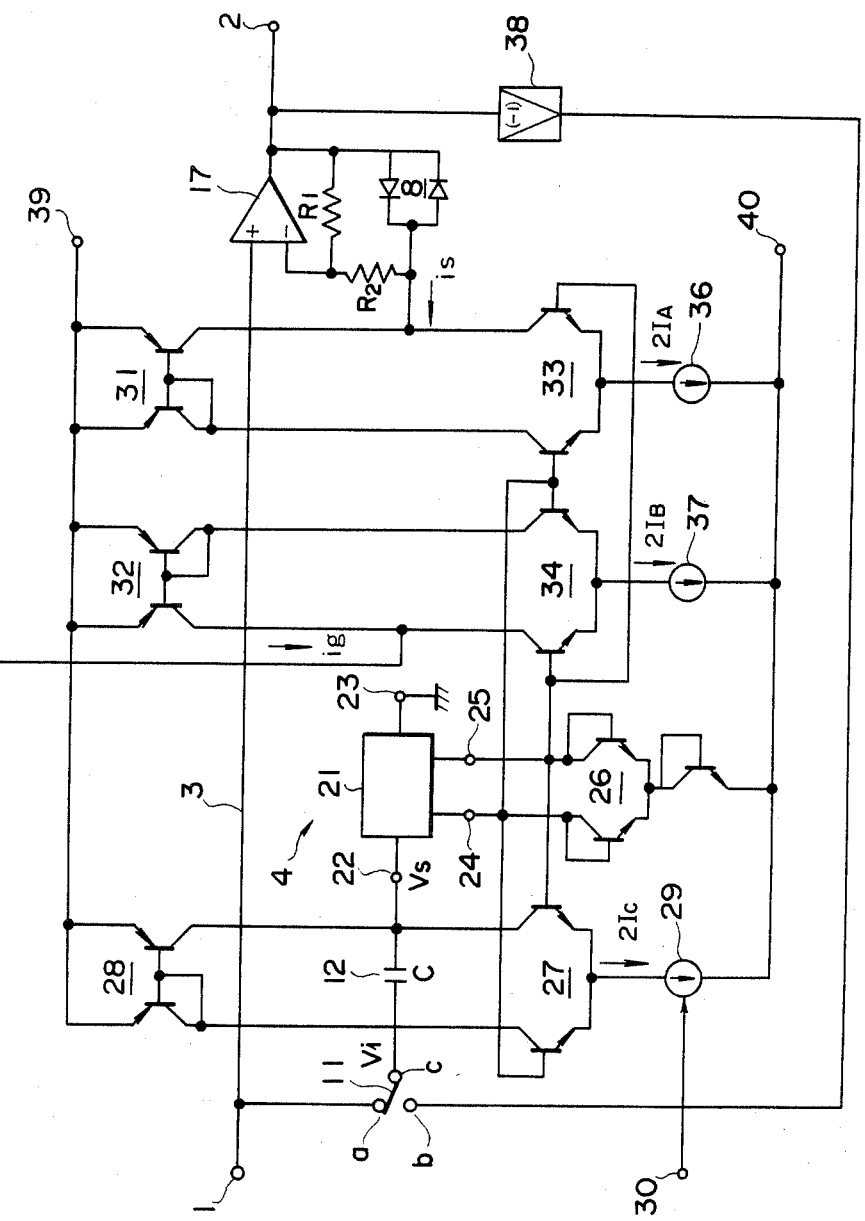
FIG. 5 is a schematic diagram of one embodiment of a noise reduction circuit according to the present invention.

FIG. 5 shows an embodiment of the present invention having main signal path 3, which is a signal transmission line with unity gain, and auxiliary signal path 4 including a high-pass filtering characteristic with variable cut-off frequency that are connected in parallel with each other between input terminal 1 and output terminal 2. The output from main signal path 3 and the output from auxiliary signal path 4 are summed by operational amplifier 17, and the summed signals are supplied to output terminal 2. Although not shown, the control circuit for varying the cut-off frequency of the high-pass filter in the auxiliary signal path 4 is typically constructed and arranged so that the auxiliary signal path output is sampled, the signal level of the sampled output detected, and the value of the resistance component of the filter circuit portion of the auxiliary signal path is varied depending upon the detected output level.

While the circuit shown in FIG. 5 operates principally to provide signal compression, it can also provide signal expansion by the operation of changeover switch 11, whereby the auxiliary signal path acts as a negative feedback path during signal expansion. In that case, however, because input and output terminals 1 and 2 are in phase with each other, inverting amplifier 38 with unity gain is connected between output terminal 2 and changeover switch 11.

In regard to auxiliary signal path 4, one terminal of capacitor 12, which forms part of the high-pass filter with the variable cut-off frequency, is connected to the common terminal of changeover switch 11 and the other terminal of capacitor 12 is connected to a differential input terminal 22 of voltage-to-current converter 21, which has differential input and output terminal pairs. The other differential input terminal 23 of voltage-to-current converter 21 is connected to ground. Differential output terminals 24 and 25 of voltage-to-current converter 21 are connected to the ends of a PN junction pair 26 formed of two transistors connected as diodes and having common connections at the other or cathode ends.

Also connected, respectively, to terminals 24 and 25 of voltage-to-current convertor 21 are the base electrodes of a first pair 27 of transistors that are connected in common emitter configuration. A current inverter or current mirror circuit 28 is connected between the collector electrodes of first common emitter transistor pair 27 and the output current therefrom is fed back to one differential input terminal 22 of voltage-to-current converter 21. Current source 29 is connected to the common emitter circuit of first common emitter transistor pair 27 and the current flowing in current source 29 is controlled by the output of the above-described cutoff frequency control circuit (not shown), through control input terminal 30.

Thus, looking into the circuit at terminal 22 the circuit appears as a variable impedance circuit grounded at one end, with the variable impedance dependent upon the current flowing through current source 29.

The base electrodes of second common emitter transistor pair 33 are connected, respectively, to the output terminals 24 and 25 of voltage-to-current converter 21, as are the base electrodes of a third emitter common transistor pair 34, which provides the high-pass filter output to amplitude limiting circuit 8. Current mirror circuits 31 and 32 are connected as loads to second and third common emitter transistor pairs 33 and 34, respectively, and second and third current sources 36 and 37 are connected to the common emitter paths of transistor pairs 33 and 34, respectively.

The output current from the collector circuit of second common emitter transistor pair 33 is the auxiliary signal path output fed to amplitude limiting circuit 8 and on to the inverting input of operational amplifier 17, which functions as the signal path summing means. This auxiliary signal path output is summed in amplifier 17 with the main signal path output, and the resultant output signal is fed to output terminal 2. The output of third common emitter transistor pair 34 is taken off at terminal 35 to be supplied to control input terminal 30 through the above-described control circuit (not shown). Terminals 39, 40 and designate plus and minus voltage source connections, respectively.

Figure 6A:
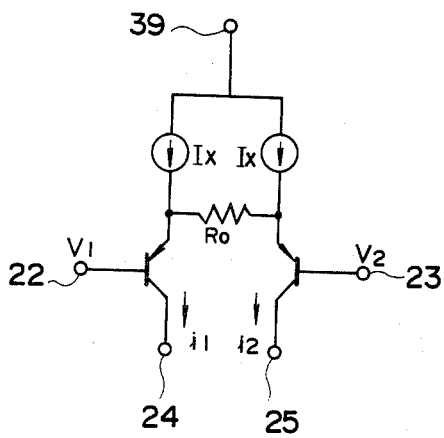
FIGS. 6A and 6B are schematic diagrams of embodiments of voltage-to-current converters for use in the embodiment of FIG. 5.
Figure 6B:
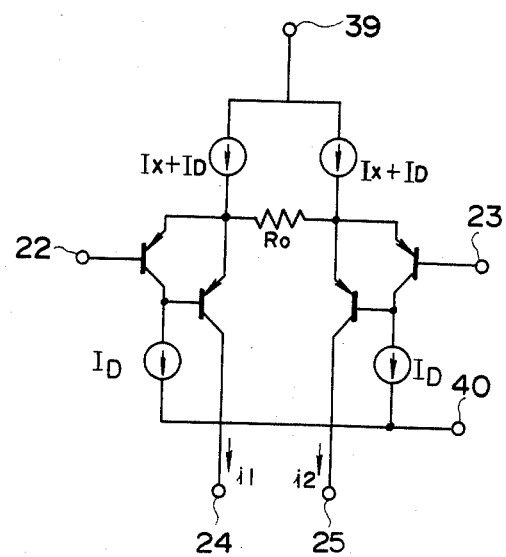

Voltage-to-current converter 21 is of the differential input and output kind and may be configured as shown in FIGS. 6A or 6B. In FIG. 6A, input voltages $v_1$ and $v_2$ are applied to differential input terminals 22 and 23, respectively, which are connected to the base circuits of two PNP transistors. A resistance $R_0$ is connected across the emitters of these transistors, and two equal currents $I_x$ are supplied from the plus voltage source terminal 39 through the constant current sources to the connection points of the ends of resistance $R_0$ and the respective emitters. Under these conditions, the output currents $i_1$ and $i_2$ supplied at collector circuit output terminals 24 and 25, respectively, of the transistor pair are expressed as:

$$i_1 = I_x - (v_1 - v_2)/R_0 \qquad (3)$$

$$i_2 = I_x + (v_1 - v_2)/R_0 \qquad (4)$$

Subtracting equation (4) from (3) yields:

$$i_1 - i_2 = -\frac{2}{R_0} \cdot (v_1 - v_2) \qquad (5)$$

Thus, the output current difference $i_1 - i_2$ is proportional to the input voltage difference $v_1 - v_2$.

In the circuit shown in FIG. 6A, the base to emitter voltage $V_{BE}$ at each of the two PNP transistors is affected by the changes in the currents, therefore, for improved accuracy and linearity, the circuit shown in FIG. 6B is preferred. In this circuit, four PNP transistors are connected in a feedback configuration with differential inputs and differential outputs, so that constant currents $I_D$ flow through a transistor pair forming the differential input stage and, thus, the voltage difference across resistance $R_0$ is maintained at $v_1 - v_2$, despite any fluctuation in currents $i_1$ and $i_2$, which flow through a transistor pair of the differential output stage.

The combination of PN junction pair 26, which is connected to the differential output terminals 24 and 25 of voltage-to-current converter 21, with one of the first, second, or third common emitter transistor pairs 27, 33, and 34, respectively, is known as a multiplier circuit. Thus, in the multiplier circuit shown in FIG. 7 formed of PN junction circuit 26 and common emitter transistor pair 27, the currents $i_1$ and $i_2$ flow through PN junctions 26a and 26b, respectively, of PN junction pair 26, and a current $2I_x$ flows through the common emitter output circuit. Currents $i_3$ and $i_4$ flow through transistors 27a and 27b, respectively, of transistor pair 27, and a current $2I_y$ flows through the common emitter output path. Since the PN junction of transistor 26a has its anode connected to a base electrode of transistor 27a, and the PN junction of transistor 26b has its anode connected to a base electrode of transistor 27b, the currents $i_3$ and $i_4$ can be expressed as:

$$i_3 = i_1 \cdot I_y / I_x \tag{6}$$

$$i_4 = i_2 \cdot I_y / I_x \tag{7}$$

Figure 7:
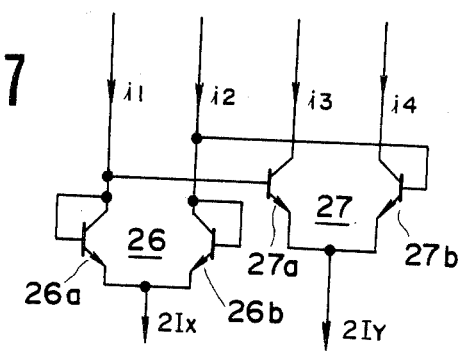
FIG. 7 is a schematic diagram of one embodiment of a current multiplier for use in the circuit of FIG. 5.

When the inputs of the circuit of FIG. 7 are connected to the outputs of a voltage-to-current converter, such as that shown in either FIGS. 6A or 6B, the resulting combined circuit is a transconductance circuit, and the currents $i_3$ and $i_4$ may be expressed as:

$$i_3 = I_y - (v_1 - v_2) \cdot I_y / I_x \cdot R_0 \tag{8}$$

$$i_4 = I_y + (v_1 - v_2) \cdot I_y / I_x \cdot R_0 \tag{9}$$

By connecting this common emitter transistor pair to a current mirror circuit, the output current $i_o$ is expressed as the difference between $i_3$ and $i_4$ and, thus:

$$\begin{aligned} i_o &= i_3 - i_4 \\ &= 2(v_1 - v_2) \cdot I_y / I_x \cdot R_0 \end{aligned} \tag{10}$$

Current mirror circuits 28, 31, and 32 are connected to the common emitter transistor pairs 27, 33, and 34 of FIG. 5, respectively. The output current of voltage-to-current converter 21 is fed back to one input terminal 22 of voltage-to-current converter 21, and the output current $i_g$ of third common emitter transistor pair 34 is used to derive the control current, as described hereinabove.

With the output signal of the first common emitter transistor pair 27 being fed back to input terminal 22 of voltage-to-current convertor 21, the impedance viewed from terminal 22 is equivalent to a resistance that is connected to ground at the other end. The resistance value r is expressed as:

$$r = \frac{R_0}{2} \cdot \frac{I_x}{I_c} \tag{11}$$

The current $I_c$ in equation (11) is equivalent to the current $I_y$ discussed above, since the current $2I_c$ flows in first current source 29 connected to the common emitter path of first transistor pair 27. Assuming that the input and output of a high-pass filter made up by resistance r and capacitor 12 are designated as $V_i$ and $V_s$, respectively, and are a function of a complex angular frequency, then:

$$V_s = V_i \cdot \frac{Cr}{1 + sCr} \tag{12}$$

Based on equation (12), it is seen that the circuit shows a primary high-pass characteristic having a pole at $1/Cr$, the frequency for this pole being controlled by a current $I_c$ that is varied by the control signal from control terminal 30.

If the currents flowing in the second and third current sources 36 and 37, connected respectively to the common emitter paths of the second and third common emitter transistor pairs 33 and 34, are designated as $I_A$ and $I_B$, respectively, the functions of complex variables $I_S$ and $I_g$ may be written as:

$$I_g = V_S \cdot \frac{2}{R_0} \cdot \frac{I_B}{I_x} \tag{14}$$

It should be noted that the output current $i_s$ from the second common emitter transistor pair 33 is supplied as an auxiliary signal path output to the inverting input terminal of operational amplifier 17 through amplitude limiting circuit 8, with operational amplifier 17 acting as a signal summing element. A series circuit of two resistors $R_1$ and $R_2$ is connected in parallel with amplitude limiting circuit 8, which consists of two reversed, parallel-connected diodes, and the junction formed by connecting circuit 8 and the resistor $R_1$ is connected to the output of operational amplifier 17, while the voltage dividing point at the connection of the two resistors $R_1$ and $R_2$ is connected to the inverting input terminal of operational amplifier 17, and the junction of the resistor $R_2$ and circuit 8 is connected to the output of the second common emitter transistor pair 33. For details of the amplitude limiting circuit and the operational amplifier, reference should be had to copending U.S. application Ser. No. 451,453 filed Dec. 20, 1982 and assigned to the assignee hereof, the disclosure of which is herein incorporated by reference. Since resistor $R_1$ provides an auxiliary output signal path, the limiter level of amplitude limiting circuit 8 (equal to approximately 1.2 $V_{p-p}$ in the case of reversed, parallel-connected silicon diodes) is multiplied by $R_1/(R_1+R_2)$. Thus, it can be seen that assuming $R_2=2R_1$, the amplitude limiting level is lowered to approximately 0.4 $V_{p-p}$.

In the noise reduction circuit described above, since the auxiliary output signal path is obtained as a current source output, summing the main path and auxiliary path signals together and limiting the amplitude to an optimum level may be effected by the single operational amplifier, thus, eliminating the requirement for the buffer operational amplifier (14 of FIG. 4) and simplifying the circuit, while increasing circuit accuracy. Operational amplifier 17, because of its straightforward connection as a signal summation element, operates as a perfect voltage follower with respect to the main signal. Operational amplifier 17 and its associated feedback circuitry is low in reverse bias drain current characteristics, while being relatively free from the effects of non-linearity in the resistance of the diffused area in an integrated circuit implementation. Moreover, the circuit gain is accurate and is not dependent on the precision of the resistance values. The reverse bias or drain current flowing through amplitude limiting circuit 8 does not flow into the grounding circuit, as in prior art systems and, thus, it is relatively free from the effects of the common ground circuit impedance.

Figure 8:
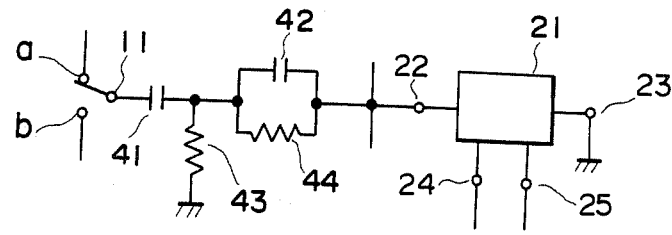
FIG. 8 is a schematic diagram of another embodiment of a noise reduction circuit according to the present invention.

FIG. 8 shows an embodiment of the high-pass filter that forms a portion of another embodiment of the present invention. The high-pass filter of FIG. 8 is made up of two capacitors 41 and 42, two resistances 43 and 44, and a feedback circuit, which is formed by the above-described voltage-to-current converter 21 and a multiplier having an equivalent resistance r. This circuit has a high-pass filter characteristic with a transfer function having two poles and a zero point. The circuit of FIG. 8 is similar in all other respects to the embodiment of the high-pass filter shown in FIG. 5, and any further description would be redundant and is not set forth in the interests of clarity and brevity.

Figure 9:
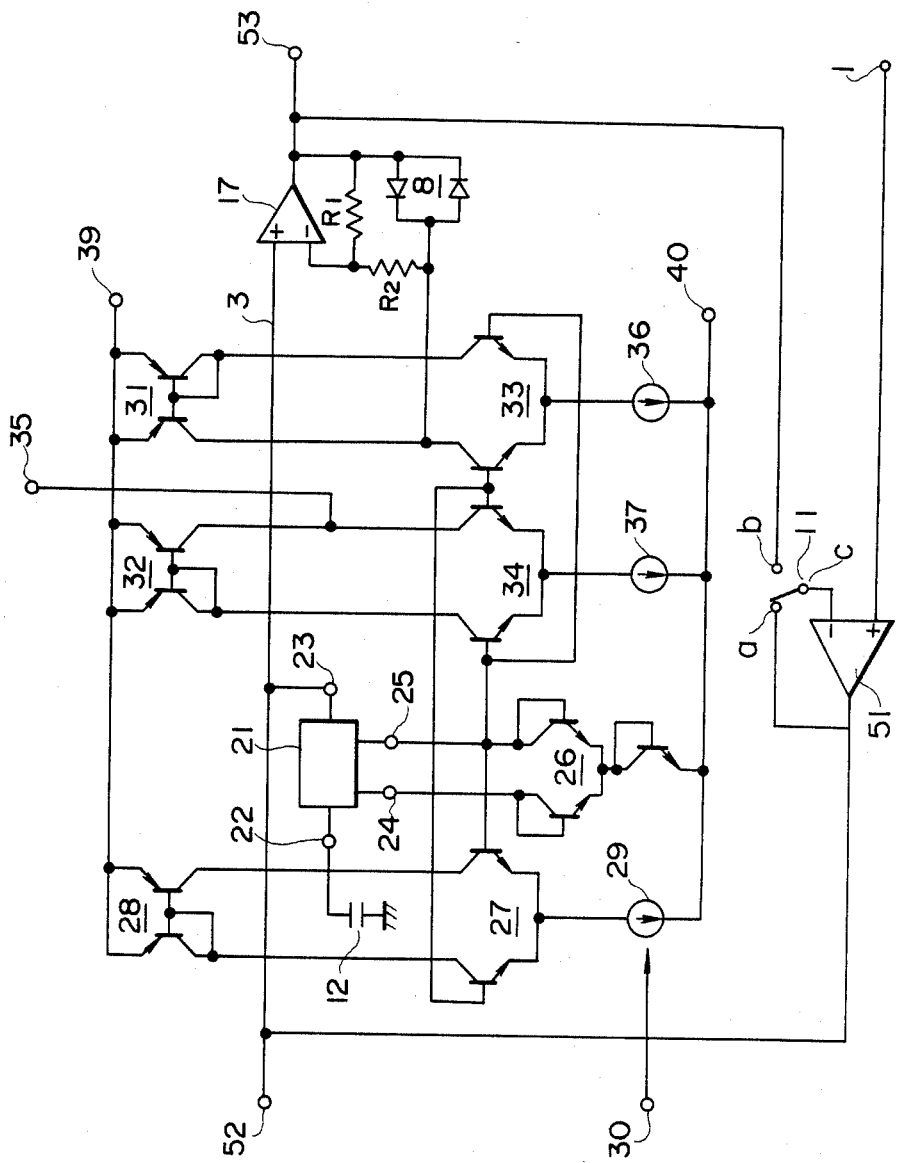
FIG. 9 is a schematic diagram of still another embodiment of a noise reduction circuit according to the present invention.

FIG. 9 shows another embodiment of the noise reduction circuit according to the present invention that differs from the embodiment described above in the switching between the compression and expansion modes and in the construction of the high-pass filter. The switching between compression and expansion is effected by changing the connection between operational amplifier 51 and the main circuit portion that provides the compression capability. When changeover switch 11 is set to connect terminals a and c, operational amplifier 51 acts as a unity gain amplifier or voltage follower, so that the input signal fed to input terminal 1 is supplied in an unmodified form by operational amplifier 51 to input terminal 52 of the main compression circuit, and the compressed output signal is produced at output terminal 53. When switch 11 is set to connect terminals b and c, the compression circuit is connected as an input to operational amplifier 51, and the circuit portion between input terminal 1 and output terminal 53 then performs signal expansion, which is complementary to the signal compression described hereinabove.

Referring now to the high-pass filter circuit in the embodiment of FIG. 9, the equivalent resistance r formed by voltage-to-current converter 21, PN junction pair 26, and the first common emitter transistor pair 27 is not connected directly to ground, as in the embodiment of FIG. 5, but is floating and is connected to ground only through capacitor 12. The other end of capacitor 12 is connected to one differential input 22 of voltage-to-current converter 21, with the other differential input 23 being connected to main signal path 3, and the output of the first common emitter transistor pair 27 is also connected to differential input terminal 22 in a feedback circuit configuration. The remaining circuit elements in the embodiment of FIG. 9 are similar to those of the first embodiment shown in FIG. 5, these components are designated in FIG. 9 by the same reference numerals and the corresponding duplicative description is omitted in the interests of clarity and brevity.

In the embodiment of FIG. 9, improved performance is obtained over the embodiment discussed hereinabove, for example, in the first embodiment switching between the compression and expansion modes can be accomplished easily by a single changeover switch 11 only when the main signal path 3 gain is unity, otherwise the switching arrangement is complicated. In this embodiment, there is no such constraint and the switching between compression and expansion mode can be realized easily, even when main signal path 3 has a nonlinear frequency characteristic. Moreover, inverting amplifier 38 of the embodiment of FIG. 5 is eliminated in the embodiment of FIG. 9, further simplifying circuit construction.

Turning now to the circuit elements forming the high-pass filter in the embodiment of FIG. 9, only one connection pin is required for connection of the ungrounded terminal of capacitor 12, so that the number of connection pins required for an integrated circuit implementation is reduced in relation to the first embodiment. In addition, it is not necessary that the preceding stage of the voltage-to-current converter 21 have a low impendance, because of the high input impedance of voltage-to-current converter 21, when viewed from the opposite input terminal 23.

Figure 10:
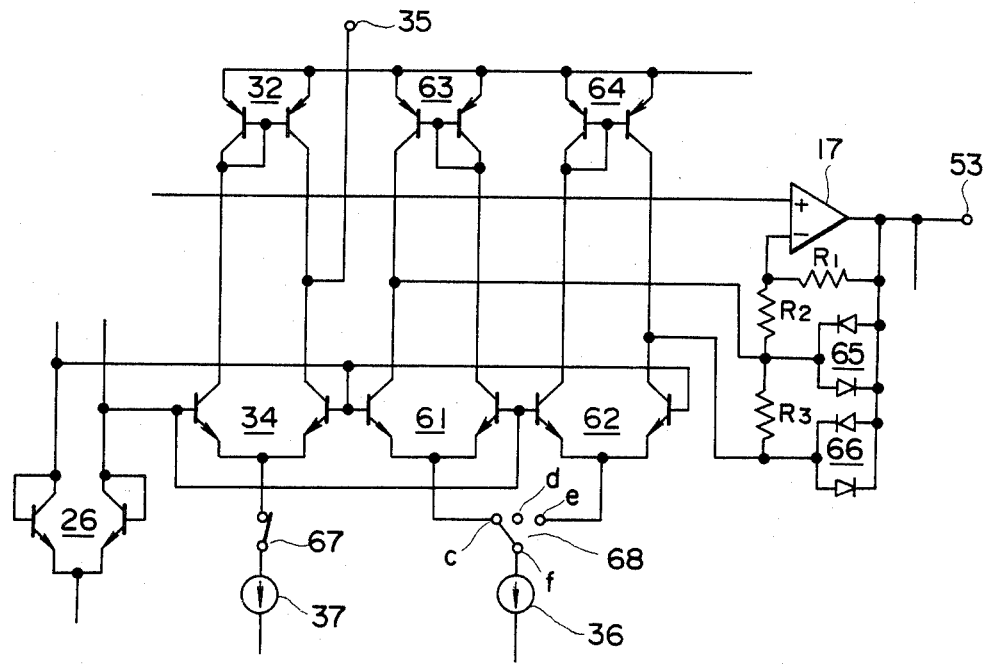
FIG. 10 is a schematic diagram of a further embodiment of a noise reduction circuit according to the present invention.

FIG. 10 shows only the essential portions of embodiment of the noise reduction circuit according to the present invention and since the remaining circuit components are similar to the corresponding parts of the embodiments discussed in detail hereinabove they are not shown in FIG. 10, in the interests of brevity and clarity. This embodiment provides for disengagement of the noise reduction mode of operation and for switching of the limiter level of the amplitude limiting circuit. Thus, in FIG. 10, two common emitter transistor pairs 61 and 62 are provided in place of the single common emitter transistor pair 33 of the preceding embodiments, and common emitter transistor pairs 61 and 62 are connected to current inverting or current mirror circuits 63 and 64, respectively. The output currents of these common emitter transistor pairs 61 and 62 are supplied to inputs of first and second amplitude limiting circuits 65 and 66, respectively. Switch 67 is connected between the common emitter circuit of common emitter transistor pair 34 and a third current source 37. The emitter circuits of common emitter transistor pairs 61 and 62 are connected to changeover terminals c and e, respectively, of triple-pole changeover switch 68. The common terminal f of switch 68 is connected to second current source 36, and the remaining switch terminal d is open. Resistors $R_1$ and $R_2$ are connected in series and the combination is arranged in parallel with first amplitude limiting circuit 65, and another resistor $R_3$ is connected to resistors $R_1$ and $R_2$, with the series combination of all three resistors being connected in parallel with second amplitude limiting circuit 66. One end of resistor $R_1$ is connected to the output of operational amplifier 17, and the inverting input of operational amplifier 17 is connected to the voltage dividing point at the connection between resistors $R_1$ and $R_2$. The output current of the common emitter transistor pair 61 is supplied to the junction formed by the connection of resistors $R_2$ and $R_3$ and amplitude limiting circuit 65, while the output current of the common emitter transistor pair 62 is supplied to the junction formed by one end of resistor $R_3$ and amplitude limiting circuit 66.

In the present embodiment, with switch 67 open and changeover switch 68 set to the terminal d (also open), the common emitter transistor pairs 34, 61, and 62 are turned off, thereby disengaging the noise reduction mode of operation and all signal flow is through the main signal path. With switch 67 open and switch 68 actuated to connect either terminals c and f or e and f, the noise reduction mode is engaged and the limiting level is set to a higher or lower value depending on whether switch 68 is actuated to terminals c or e, respectively. In this manner, engaging or disengaging the noise reduction mode or switching the limiter level is easily achieved.

Figure 11:
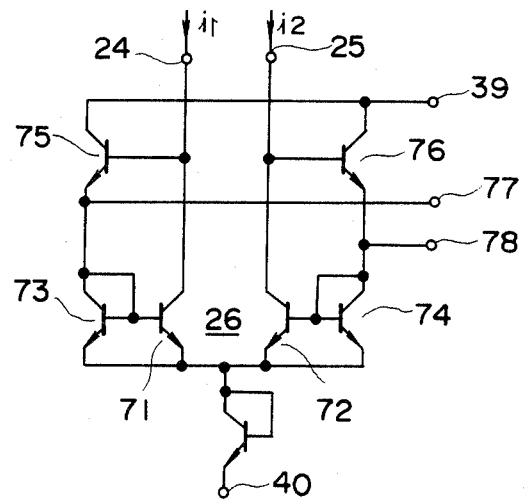
FIG. 11 is a schematic diagram showing a modification of the PN junction pair used in the present invention.

FIG. 11 shows a modification of the PN junction pair 26, employed in the embodiments described above, principally formed of NPN transistors 71 and 72, the collector circuits of which are connected to output terminals 24 and 25, respectively, of voltage-to-current converter 21. Transistors 71 and 72 make up current inverting or current mirror circuits in cooperation, respectively, with transistors 73 and 74 connected in diode configuration. The base circuits of transistors 71 and 72 are connected, respectively, to the emitter circuits of transistors 75 and 76, which are connected in the emitter follower configuration, and which are also connected to output terminals 77 and 78. These output terminals 77 and 78 correspond to connections to the base circuits of the common emitter transistor pairs 27, 33, and 34 as described above. The base circuits of transistors 75 and 76 of the PN junction circuit of FIG. 11 are connected to the collector circuits, respectively, of transistors 71 and 72 of PN junction pair 26.

In the circuit arrangement of FIG. 11, transistors 75 and 76, which are connected as emitter followers, are equivalent in operation to the PN junction pair discussed above in connection with FIG. 7 because these transistors provide a feedback path through which the output currents $i_1$ and $i_2$ of voltage-to-current converter 21 are counterbalanced with collector currents of transistors 71 and 72. In the circuit of FIG. 11, the effects on circuit performance of the increased base current supplied to the common emitter transistor pairs connected to output terminals 77 and 78 are negligible, because such base currents are supplied through transistors 75 and 76, which are connected in emitter follower configuration. Transistors 73 and 74, which are connected as diodes, and which act to control the bias current of transistors 73 and 74, may be replaced by resistors of appropriate value.

In the noise reduction circuit shown in the figures and described hereinabove, the auxiliary signal path current is taken as a current source output and, thus, the summing of the auxiliary signal to the main signal and limiting the signal amplitude can be achieved by a single operational amplifier, without requiring a buffer amplifier as in the heretofore known noise reduction circuits. In an integrated circuit implementation, since the signal summing device acts as a perfect voltage follower with respect to the main signal, it is not affected by any nonlinear resistance of the diffused area in the integrated circuit structure and it is also low in reverse bias drain current characteristics. Moreover, the circuit has a high gain so that it is not affected by variations in resistance values. The effects of the common ground impedance are minimized because the drain current flowing in the amplitude limiting circuit does not flow into the common ground circuit. In addition, switching of the noise reduction mode and the limiter level can be made very easily.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention, as defined in the appended claims.

What is claimed is:

1. A noise reduction system having a main signal path and an auxiliary signal path with the characteristics of a high-pass filter having a controllable cut-off frequency, an output signal of the main signal path and an output signal of the auxiliary signal path being summed to form a system output signal, in which the auxiliary signal path comprises:
   voltage-to-current converter means having differential inputs connected to said main signal path and differential outputs;
   PN junction means connected to said differential outputs of said voltage-to-current converter means;
   a first common emitter configuration transistor pair having base electrodes connected to said PN junction means;
   capacitance means connected to a first differential input of said voltage-to-current converter means;
   feedback means connecting a collector circuit of said first common emitter transistor pair to said first differential input of said voltage-to-current converter means; and
   a second common emitter configuration transistor pair having base electrodes connected to said PN junction means, whereby said output signal of the auxiliary signal path is derived from a collector circuit of said second common emitter configuration transistor pair.

2. A noise reduction system according to claim 1, in which a second differential input of said voltage-to-current converter means is connected to electrical ground, and including means for selectively connecting said capacitance means to the main signal path.

3. A noise reduction system according to claim 1, in which said capacitance means is connected between said differential input of said voltage-to-current converter means and electrical ground, and an input of said auxiliary signal path is connected to a second differential input of said voltage-to-current converter means.

4. A noise reduction system according to claim 1, in which summing means are connected for summing an output of said main signal path and an output of said auxiliary signal path, and a feedback resistance means is connected between the output of said summing means and an inverting input of said summing means, and in which an output of said second common emitter transistor pair is fed to said inverting input of said summing means and said main signal path is connected to a noninverting input of said summing means.

5. A noise reduction system according to claim 1, in which said PN junction means is formed of a pair of transistors each having base and collector electrodes connected together, and the emitter electrodes of said transistors of the PN junction means are connected in common.

6. A noise reduction system according to claim 1, in which said PN junction means is formed of first and second pairs of transistors, each said pair having emitter electrodes connected in common, and collector electrodes of each of said first and second pairs of transistors connected to said differential outputs of said voltage-to-current converter means and to base electrodes of fifth and sixth transistors, base electrodes of each of said first and second pairs of transistors being connected to emitter electrodes of said fifth and sixth transistors.

7. A noise reduction system according to claim 1, in which a control circuit is provided for controlling the cut-off frequency of said high-pass filter and including current control means responsive to said control circuit for controlling the emitter current of said first common emitter transistor pair.

8. A noise reduction circuit of the kind having a main signal path and an auxiliary signal path that has a transfer characteristic of a filter with a cut-off frequency variable in response to an auxiliary path output signal, an output signal of the main signal path and the output signal of the auxiliary signal path being summed to form a system output signal, the auxiliary path comprising:
   a voltage-to-current converter having differential inputs and differential outputs;

PN junction means connected to said differential outputs of said voltage-to-current converter;

capacitance means connected to a first differential input of said voltage-to-current converter;

means for connecting a second differential input of said voltage-to-current converter to electrical ground;

a first pair of common emitter configuration transistors having base circuits connected to said PN junction means, the output of said first pair of common emitter transistors being connected to said first differential input of said voltage-to-current converter; and a second pair of common emitter configuration transistors having base circuits connected to said PN junction means, the output of said second pair of common emitter transistors forming the output signal of said auxiliary path.

9. A noise reduction circuit according to claim 8, in which means are provided to produce a control signal responsive to said output signal of said auxiliary signal path for varying said cut-off frequency, and which include means for controlling the current flowing in the common emitter circuit of said first pair of common emitter transistors in response to said control signal.

10. A noise reduction circuit according to claim 8, further comprising switch means connected to the input of said main signal path and to said capacitance means for selectively connecting said first differential input of said voltage-to-current converter through said capacitance means to the input of said main signal path.

11. A noise reduction circuit according to claim 10, further comprising signal inverter means connected to the sum of said main signal path and said auxiliary signal path for producing an inverted feedback signal fed to said switch means, whereby said capacitance means can be selectively connected to said input of said main signal path or to said inverted feedback signal.

12. A noise reduction circuit according to claim 8, further comprising a current mirror circuit connected across the collector circuits of said first pair of common emitter transistors.

13. A noise reduction circuit according to claim 8, in which said PN junction means is formed of a pair of common emitter configuration transistors each having its base circuit connected to its collector circuit, and the emitter circuits of said transistors forming said PN junction means are connected together.

14. A noise reduction circuit according to claim 13, in which said pair of common emitter configuration transistors forming said PN junction means comprises first and second pairs of transistors, each pair of said transistors having the emitter electrodes connected in common and the collector electrodes of each of said first and second pairs of transistors connected to the output of said voltage-to-current converter and to the base electrodes of fifth and sixth transistors, the base electrodes of each of said first and second pairs of transistors being connected to the emitter electrodes of said fifth and sixth transistors.

15. A noise reduction circuit according to claim 1, in which said capacitance means is connected to said first differential input of said voltage-to-current converter and to electrical ground, and said second differential input of said voltage-to-current converter is connected to said main signal path.

16. A noise reduction circuit according to claim 15, further comprising means connected to sum the output signals of said main and auxiliary signal paths, operational amplifier means having said main signal path connected to a noninverting input, and switch means connected to the summed output signals of said main signal path and said auxiliary signal path, said switch means also being connected to the output of said operational amplifier means and to said inverting input of said operational amplifier means for selectively connecting to said inverting input either the summed signals or said output of said operational amplifier means.

17. A noise reduction circuit of the kind having a main signal path and an auxiliary signal path that has a transfer characteristic of a high-pass filter with a cut-off frequency that is variable in response to the auxiliary path output signal, in which the auxiliary path comprises:

voltage-to-current converter means having differential inputs and differential outputs;

PN junction means connected to said differential outputs of said voltage-to-current converter means;

capacitance means connected between a first differential input of said voltage-to-current converter and electrical ground;

means for connecting a second differential input of said voltage-to-current converter means to said main signal path;

a first pair of transistors connected in common emitter configuration and having base circuits connected to said PN junction means, an output of said first pair of common emitter transistors being connected to said first differential input terminal of said voltage-to-current converter means;

a second pair of transistors connected in common emitter configuration and having base circuits connected to said PN junction means, an output of said second pair of transistors forming the output of said auxiliary signal path; and signal summing means having inputs connected to said main signal path and to the output of said auxiliary signal path for producing a circuit output signal having reduced noise.

18. A noise reduction circuit according to claim 17, further comprising means responsive to said output signal of said auxiliary signal path for providing a control signal, and means for varying the cut-off frequency of the high-pass filter, including means for controlling the current flowing in the common emitter circuit of said first pair of transistors in response to said control signal.

19. A noise reduction circuit according to claim 17, in which said PN junction means is formed of a third pair of transistors each having its base circuit connected to its collector circuit, and the emitters circuits of said third pair of transistors are connected together.

20. A noise reduction circuit according to claim 17, in which said PN junction means comprises fourth and fifth pairs of transistors, each of said fourth and fifth pairs having the emitter electrodes connected in common and the collector electrodes of each of said fourth and fifth pairs of transistors connected to the output of said voltage-to-current converter means and to the base electrodes of a sixth pair of transistors, the base electrodes of each of said fourth and fifth pairs of transistors being connected to the emitter electrodes of said sixth pair of transistors.

21. A noise reduction circuit according to claim 17, further comprising operational amplifier means having said main signal path connected to a noninverting input, and switch means connected to said circuit output signal and to the output of said operational amplifier means and to an inverting input of said operational amplifier means for selectively connecting to said inverting input either said circuit output signal or said output of said operational amplifier means.

* * * * *